(12) United States Patent
Naiki

(10) Patent No.: US 12,057,790 B2
(45) Date of Patent: Aug. 6, 2024

(54) CONTROL SYSTEM AND CONTROL METHOD FOR CONTROLLING DISPLACEMENT OF BASE

(71) Applicant: ROHM CO., LTD., Kyoto (JP)

(72) Inventor: Takashi Naiki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 362 days.

(21) Appl. No.: 17/670,841

(22) Filed: Feb. 14, 2022

(65) Prior Publication Data

US 2022/0286065 A1 Sep. 8, 2022

(30) Foreign Application Priority Data

Mar. 2, 2021 (JP) ................... 2021-032633

(51) Int. Cl.
*H02N 2/06* (2006.01)
*G01B 7/16* (2006.01)
*H10N 30/20* (2023.01)

(52) U.S. Cl.
CPC ............. *H02N 2/06* (2013.01); *G01B 7/18* (2013.01); *H10N 30/20* (2023.02)

(58) Field of Classification Search
CPC ........ H02N 2/06; H10N 30/20; H10N 30/802; H04R 3/04; H04R 29/002; H04R 17/00; G01B 7/18
See application file for complete search history.

(56) References Cited

U.S. PATENT DOCUMENTS 9,891,424 B2 * 2/2018 Hirokubo ............... H02N 1/006

FOREIGN PATENT DOCUMENTS

JP 2018182533 A 11/2018

* cited by examiner

*Primary Examiner* — Emily P Pham
(74) *Attorney, Agent, or Firm* — HSML P. C.

(57) ABSTRACT

A control system includes: a piezoelectric element having a deformation amount that varies according to a magnitude of a drive voltage applied to the piezoelectric element; a base on which the piezoelectric element is arranged; a deformation sensor configured to detect a displacement of the base caused by deformation of the piezoelectric element and output the displacement as a displacement signal; and a drive device configured to apply the drive voltage to the piezoelectric element while adjusting the magnitude of the drive voltage so as to reduce a difference between a value of the displacement signal and a value of a setting signal.

12 Claims, 6 Drawing Sheets

CONTROL SYSTEM AND CONTROL METHOD FOR CONTROLLING DISPLACEMENT OF BASE

CROSS-REFERENCE TO RELATED APPLICATION

This application is based upon and claims the benefit of priority from Japanese Patent Application No. 2021-032633, filed on Mar. 2, 2021, the entire contents of which are incorporated herein by reference.

TECHNICAL FIELD

The present disclosure relates to a control system and a control method for controlling a displacement of a base on which a piezoelectric element is arranged.

BACKGROUND

By applying a drive voltage to a piezoelectric element, deformation occurs in the piezoelectric element due to an inverse piezoelectric effect. A device that deforms a base having such a piezoelectric element arranged thereon by utilizing a stress caused by the deformation of the piezoelectric element has been known. For example, a vibration system such as a piezoelectric speaker or the like that vibrates a laminated structure of a piezoelectric element and an electrode has been implemented. As a material of the piezoelectric element, a ferroelectric material such as lead zirconate titanate (Pb(Zr, Ti)O$_3$: PZT) is often used.

It is known that a relationship between a drive voltage applied to a ferroelectric material and deformation of a piezoelectric element differs between at a rising time of the drive voltage and at a falling time of the drive voltage. Therefore, for example, even when a predetermined drive voltage applied to a piezoelectric element at a falling time thereof causes a base to have a desired displacement, the base cannot have a desired magnitude of displacement when the drive voltage is applied at a rising time thereof.

SUMMARY

Some embodiments of the present disclosure provide a technique capable of improving accuracy of a displacement of a base having a piezoelectric element arranged thereon with respect to a drive voltage.

According to one embodiment of the present disclosure, there is provided a control system including: a piezoelectric element; a base on which the piezoelectric element is arranged; a deformation sensor configured to detect a displacement of the base caused by deformation of the piezoelectric element; and a drive device configured to apply the drive voltage to the piezoelectric element. The piezoelectric element has a deformation amount that varies according to a magnitude of the drive voltage applied to the piezoelectric element. The deformation sensor is configured to output the displacement as a displacement signal. The drive device is configured to adjust the magnitude of the drive voltage so as to reduce a difference between a value of the displacement signal and a value of a setting signal.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
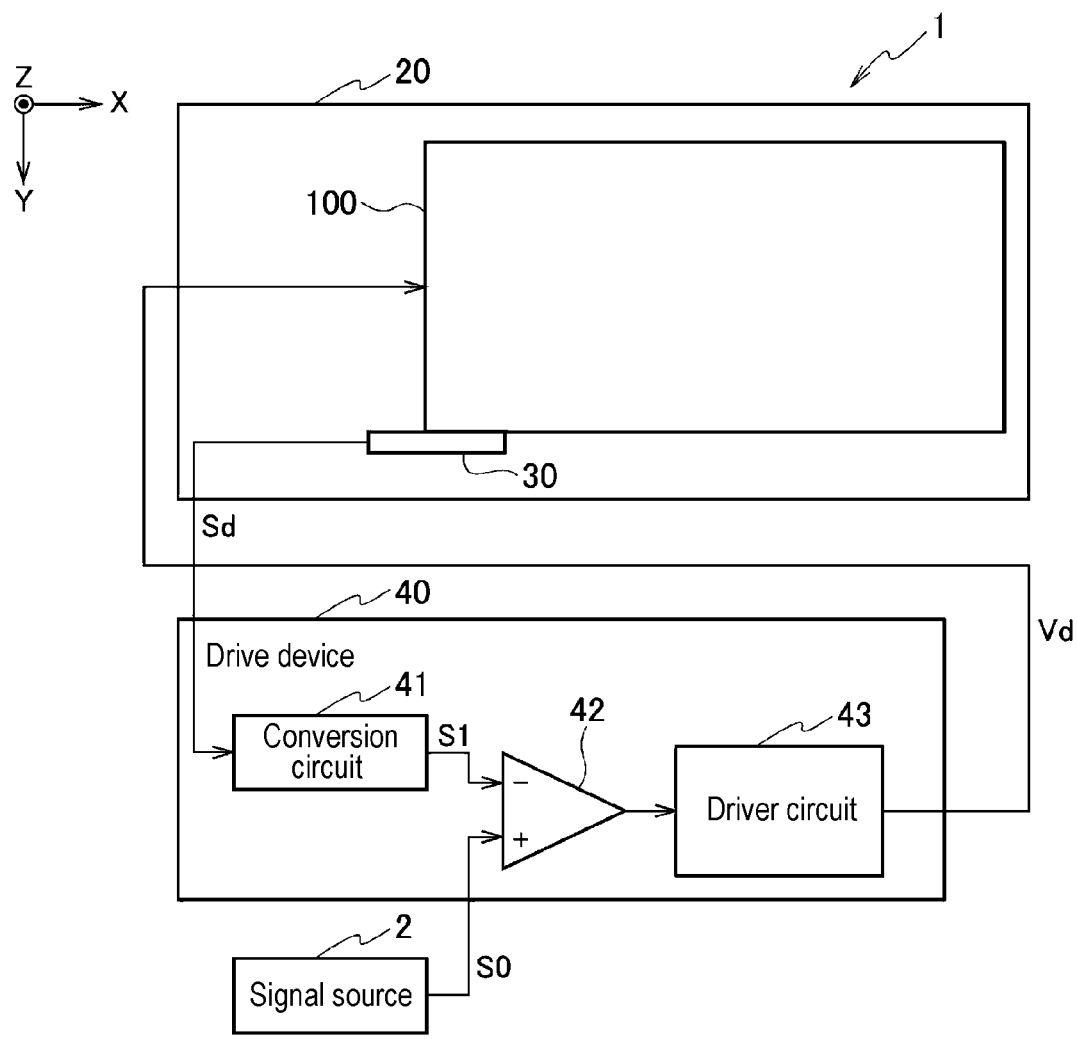
FIG. 1 is a schematic diagram showing a configuration of a control system according to a first embodiment.

Next, embodiments will be described with reference to the drawings. In the description of the drawings below, the same or similar parts are designated by the same or similar reference numerals. However, it should be noted that the drawings are schematic, and the relationship between a thickness and plane dimensions, a ratio of thicknesses of respective parts, and the like are different from actual ones. In addition, it goes without saying that parts having different dimensional relationships and ratios are included in the respective drawings.

Further, the embodiments shown below exemplify apparatuses and methods for embodying technical ideas and do not specify a shape, structure, arrangement, and the like of components to those that follow. These embodiments may be modified in various ways within the scope of the claims.

First Embodiment

As shown in FIG. 1, a control system 1 according to a first embodiment includes a piezoelectric element 100, a base 20 on which the piezoelectric element 100 is arranged, deformation sensor 30 arranged on the base 20, and a drive device 40 for applying a drive voltage Vd to the piezoelectric element 100. The control system 1 controls a mechanical displacement of the base 20 according to a setting signal S0 from a signal source 2.

In the control system 1, when the drive voltage Vd is applied from the drive device 40 to the piezoelectric element 100, mechanical deformation occurs in the piezoelectric element 100 due to the inverse piezoelectric effect. The base 20 on which the piezoelectric element 100 is arranged is mechanically deformed by the deformation of the piezoelectric element 100. Hereinafter, an amount of deformation of the base 20 at this time is also referred to as "displacement." The amount of deformation of the piezoelectric element 100 varies according to a magnitude of the applied drive voltage Vd. Therefore, a displacement of the base 20 varies according to the magnitude of the drive voltage Vd.

The deformation sensor 30 detects the displacement of the base 20. Then, the deformation sensor 30 converts the detected displacement into an electrical displacement signal Sd and outputs the electrical displacement signal Sd.

The drive device 40 adjusts the magnitude of the drive voltage Vd so that a value of the displacement signal Sd approaches a value of the setting signal S0 from the signal source 2, and applies the adjusted drive voltage Vd to the piezoelectric element 100. That is, in the control system 1, the drive voltage Vd is set by feeding back the displacement of the base 20.

The setting signal S0 is an electrical signal set so that a predetermined displacement occurs in the base 20 when the setting signal S0 is applied to the piezoelectric element 100. The setting signal S0 is, for example, a signal of a sound source that vibrates the piezoelectric element 100 as a piezoelectric speaker. In that case, the signal source 2 is the sound source.

In the control system 1, the drive voltage Vd is adjusted so as to reduce a difference between the value of the displacement signal Sd and the value of the setting signal S0. Therefore, even in a case where the predetermined displacement does not occur in the base 20 by applying the setting signal S0 as it is to the piezoelectric element 100, according to the control system 1, the predetermined displacement is caused to occur in the base 20 by bringing the displacement signal Sd closer to the setting signal S0.

Figure 2:
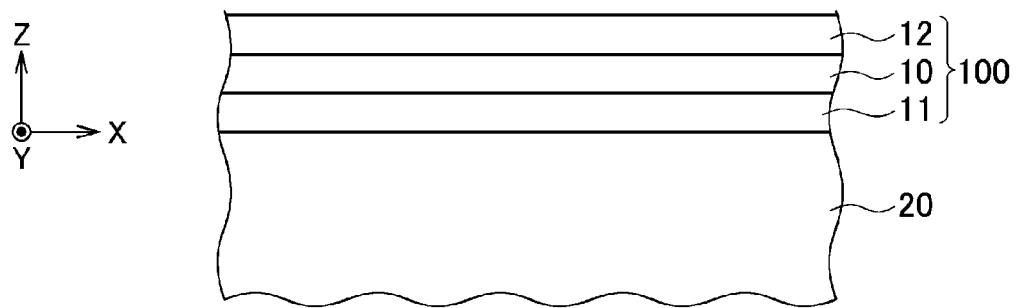
FIG. 2 is a schematic diagram showing a configuration of a piezoelectric element of the control system according to the first embodiment.

FIG. 2 shows an example of a configuration of the piezoelectric element 100. The piezoelectric element 100 shown in FIG. 2 includes a piezoelectric film 10, and a first electrode film 11 and a second electrode film 12 which sandwich the piezoelectric film 10. The piezoelectric film 10 has piezoelectric property, that is, the piezoelectric film 10 is deformed according to an increase or decrease in strength of an electric field applied to the piezoelectric film 10. Therefore, the piezoelectric film 10 is deformed according to the electric field generated in the piezoelectric film 10 by applying a voltage between the first electrode film 11 and the second electrode film 12. The piezoelectric film 10 is, for example, a ferroelectric film such as a PZT film or the like.

A material of the first electrode film 11 in contact with the base 20 is, for example, platinum (Pt). The second electrode film 12 has, for example, a two-layer structure in which an iridium oxide ($IrO_2$) layer and an iridium (Ir) layer are stacked sequentially from a side of the piezoelectric film 10.

As shown in FIG. 2, a direction in which the first electrode film 11, the piezoelectric film 10, and the second electrode film 12 are stacked is defined as a Z direction. A plane perpendicular to the Z direction is defined as an XY plane.

When the drive voltage Vd is applied to the piezoelectric element 100, an electric field in the Z direction is generated in the piezoelectric element 100. The electric field generated in the piezoelectric film 10 causes deformation in the piezoelectric film 10. The amount of deformation of the piezoelectric element 100 increases as the electric field generated in the piezoelectric film 10 increases.

Figure 3:
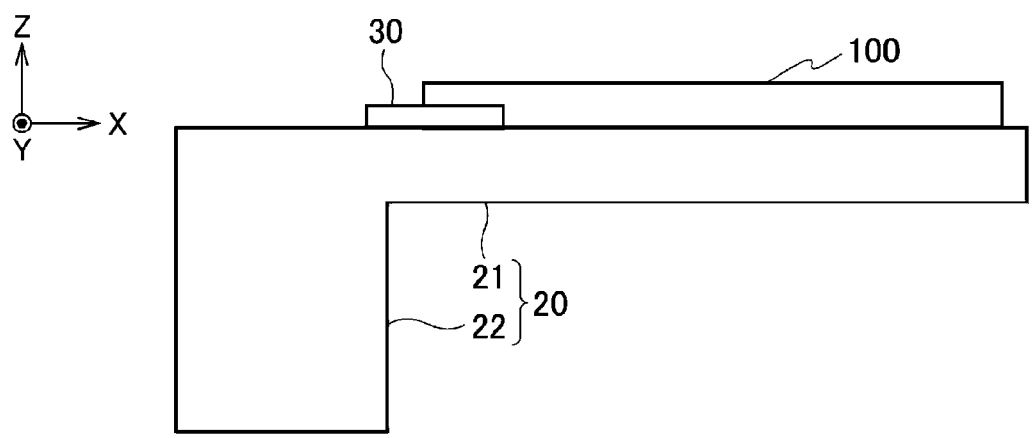
FIG. 3 is a schematic diagram showing a configuration of a base of the control system according to the first embodiment.

As shown in FIG. 3, for example, the base 20 includes a beam portion 21 on which the piezoelectric element 100 is arranged, and a support portion 22 to which an end portion of the beam portion 21 is fixed. Displacement occurs in the beam portion 21 according to the deformation of the piezoelectric element 100. A material of the base 20 is, for example, silicon. In the base 20 having a cantilever structure as shown in FIG. 3, the deformation sensor 30 is arranged in a region near a joint between the beam portion 21 and the support portion 22. The deformation sensor 30 detects the displacement generated in the beam portion 21 due to the deformation of the piezoelectric element 100.

The deformation sensor 30 converts the detected displacement of the base 20 into the electrical displacement signal Sd and outputs the electrical displacement signal Sd. The deformation sensor 30 outputs the displacement signal Sd by a conversion function f that satisfies a relationship Sd=f(d) with respect to a displacement d of the base 20. The deformation sensor 30 may be configured to include a piezoelectric resistor having an electrical resistance which varies due to mechanical deformation.

The piezoelectric resistor may be attached to or stacked on a surface of the base 20. Alternatively, when the material of the base 20 is a silicon substrate, the piezoelectric resistor may be formed on the base 20 by diffusion of impurities or implantation of ions. When the piezoelectric resistor formed by diffusion of impurities to the base 20 is used for the deformation sensor 30, a resistance value of the piezoelectric resistor may exhibit a property that is easily affected by a temperature. In that case, a circuit for performing temperature correction of the resistance value of the piezoelectric resistor is provided in the drive device 40.

The drive device 40 shown in FIG. 1 includes a conversion circuit 41, an error amplifier 42, and a driver circuit 43.

The conversion circuit 41 converts the displacement signal Sd into a comparison signal S1 to be compared with the setting signal S0. For example, in a case where the deformation sensor 30 has a structure including a piezoelectric resistor, the conversion circuit 41 outputs the comparison signal S1 obtained by converting the resistance value of the piezoelectric resistor into a voltage. In addition, when the displacement signal Sd and the setting signal S0 can be directly compared with each other, the conversion circuit 41 may be omitted.

The error amplifier 42 outputs a difference between the comparison signal S1 and the setting signal S0. As the error amplifier 42, for example, a differential amplifier may be used. Although the case where the drive device 40 has the conversion circuit 41 is shown in FIG. 1, an arithmetic processor that converts the displacement signal Sd into the comparison signal S1 may be built in the error amplifier 42.

The driver circuit 43 adjusts the drive voltage Vd so that an output of the error amplifier 42 input to the driver circuit 43 becomes small. That is, the drive device 40 adjusts the magnitude of the drive voltage Vd so that the displacement signal Sd approaches the setting signal S0. The small difference between the displacement signal Sd and the setting signal S0 means that a difference between a predetermined displacement desired to be caused on the base 20 by the setting signal S0 and a displacement actually caused on the base 20 is small. As described above, according to the control system 1, the accuracy of the displacement of the base 20 can be improved by reducing the difference between the value of the displacement signal Sd and the value of the setting signal S0.

Here, a description will be made on a decrease in accuracy of the displacement of the base 20 with respect to the drive voltage Vd due to the fact that the relationship between the drive voltage Vd and the deformation of the piezoelectric element 100 varies between at the rising time of the drive voltage Vd and at the falling time of the drive voltage Vd.

Figure 4:
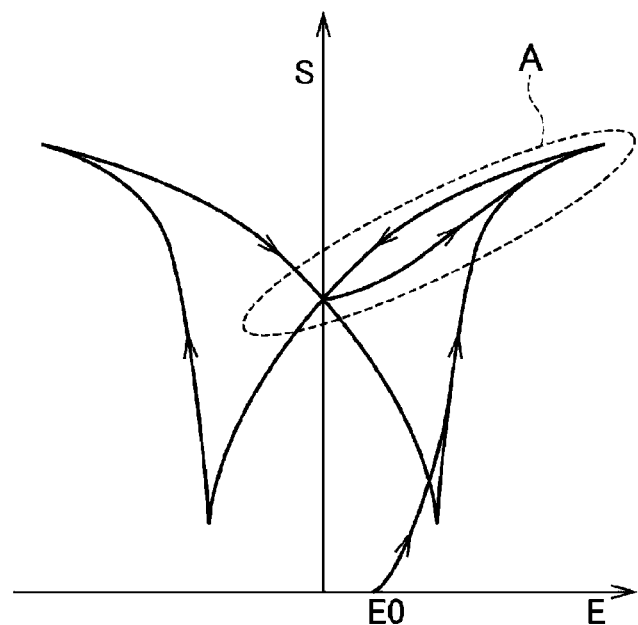
FIG. 4 is a graph showing an example of a relationship between an electric field and induced deformation.

FIG. 4 shows a relationship between an electric field E applied to a ferroelectric material and induced deformation S generated in the ferroelectric material. In the ferroelectric material, induced deformation begins to occur at an electric field E0 from an unpolarized state. Then, as the electric field E increases, the induced deformation S becomes larger. Thereafter, as the electric field E decreases, the induced deformation S becomes smaller. However, even when the electric field E becomes zero, residual deformation occurs in the ferroelectric material. Thus, the induced deformation S generated in the ferroelectric material does not become zero.

When a ferroelectric material is used for an actuator application that converts an electric signal into a physical motion, a region A surrounded by a broken line in FIG. 4 is generally used. In the region A, a change characteristic of the induced deformation S with respect to the electric field E varies between at a rising time and at a falling time of the electric field E.

Figure 5:
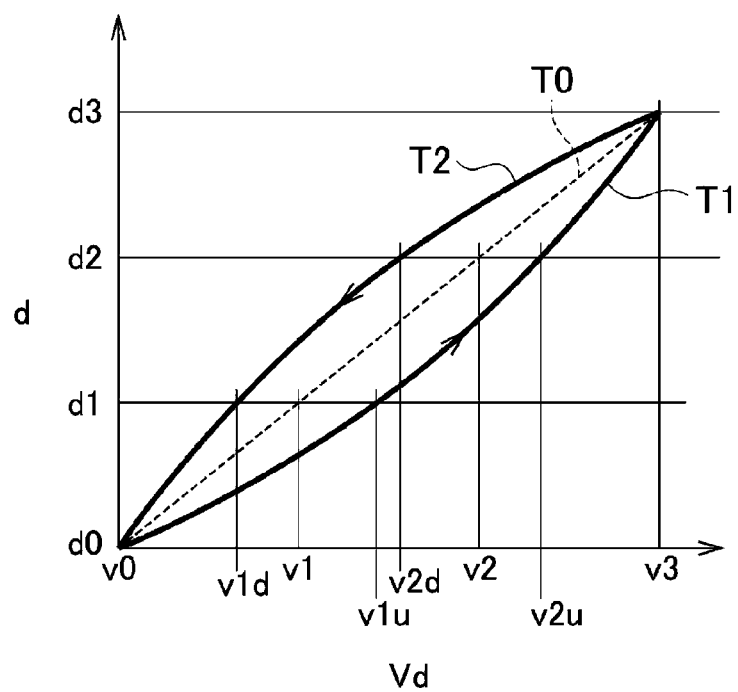
FIG. 5 is a graph showing an example of a relationship between a drive voltage and a displacement of a base.

Referring to FIG. 5, it is reviewed how the displacement d, which is generated in a base having a ferroelectric material arranged thereon by applying the drive voltage Vd to the ferroelectric material in the region A indicated in FIG. 4, is obtained.

When the displacement d is linear with respect to the drive voltage Vd, the drive voltage Vd and the displacement d are expressed by an equation $Vd=G \times d$ using an amplifier having a gain of G times. In this case, a characteristic T0 indicated by a broken line in FIG. 5 is obtained. That is, a displacement d1 is obtained by a drive voltage v1, and a displacement d2 is obtained by a drive voltage v2.

However, the displacement d of the ferroelectric material with respect to the drive voltage Vd has a hysteresis characteristic such as a characteristic T1 and a characteristic T2 indicated by solid lines in FIG. 5. That is, when the drive voltage Vd rises from a voltage v0 to a voltage v3, as shown in the characteristic T1, a drive voltage v1$u$ is required to obtain the displacement d1 and a drive voltage v2$u$ is required to obtain the displacement d2. On the other hand, when the drive voltage Vd falls from the voltage v3 to the voltage v0, as shown in the characteristic T2, a drive voltage v2$d$ is required to obtain the displacement d2 and a drive voltage v1$d$ is required to obtain the displacement d1.

As described above, while the drive voltage Vd is rising from the voltage v0 to the voltage v3, a relational expression $Vd=Fu(d)$ is established by using, for example, a nonlinear function Fu. On the other hand, while the drive voltage Vd is falling from the voltage v3 to the voltage v0, a relational expression $Vd=Fd(d)$ is established by using a nonlinear function Fd different from the nonlinear function Fu. Hereinafter, the phenomenon that the displacement d with respect to the drive voltage Vd varies between at the rising time of the drive voltage Vd and at the falling time of the drive voltage Vd is also referred to as "displacement hysteresis."

In a ferroelectric material in which displacement hysteresis occurs, for example, when it is desired to move from a location of the displacement d1 to a location of a displacement d3, a curve of a voltage applied to the ferroelectric material varies depending on whether the drive voltage Vd is rising or falling. Therefore, the accuracy of the amount of deformation of the base having the ferroelectric material arranged thereon with respect to the drive voltage Vd is lowered. For example, in a piezoelectric speaker using a ferroelectric material in which displacement hysteresis occurs, deformation of an output sound of the piezoelectric speaker occurs.

In contrast, the control system 1 compares the displacement signal Sd corresponding to the displacement of the base 20 with the setting signal S0 from the signal source 2, and adjusts the drive voltage Vd to reduce the difference between the value of the displacement signal Sd and the value of the setting signal S0. By applying the adjusted drive voltage Vd to the piezoelectric element 100, the displacement generated in the base 20 follows a desired predetermined displacement of the base 20 which is set by the setting signal S0. Therefore, according to the control system 1, even when dependency of the amount of deformation of the piezoelectric element 100 on the drive voltage Vd varies between at the rising time of the drive voltage Vd and at the falling time of the drive voltage Vd, an actual displacement of the base 20 can be brought closer to a value which is desired to be generated in the base 20 by the setting signal S0.

As described above, according to a control method using the control system 1, the accuracy of the displacement of the base 20 with respect to the drive voltage Vd is improved. For example, it is possible to improve a sound quality of headphones or earphones that include the piezoelectric element 100 as a component of a piezoelectric speaker.

<Modification>

Figure 6:
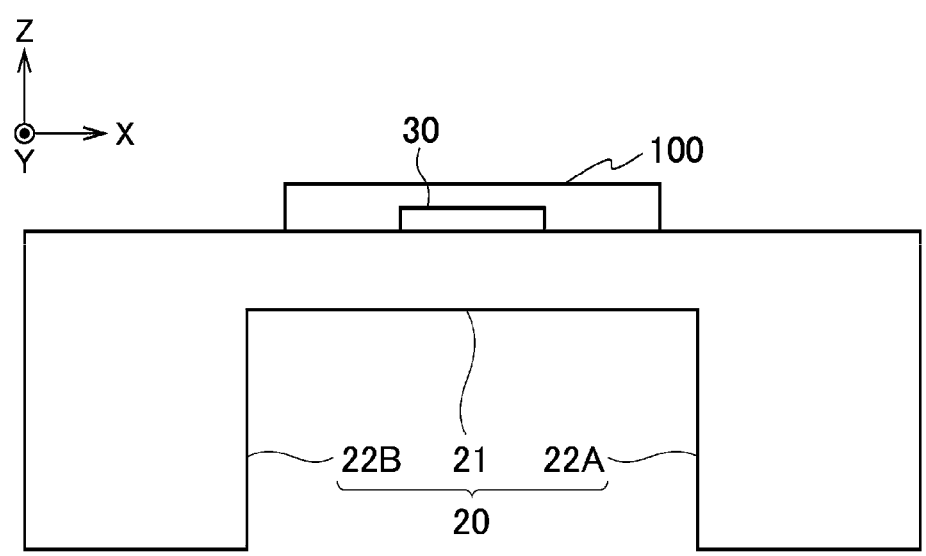
FIG. 6 is a schematic diagram showing a configuration of a base of a control system according to a modification of the first embodiment.

In the control system 1 according to a modification of the first embodiment shown in FIG. 6, the base 20 has a double-supported beam structure including a first support portion 22A and a second support portion 22B to which end portions of the beam portion 21 are fixed. The deformation sensor 30 is arranged near the center of the beam portion 21. In the base 20 of the double-supported beam structure, the beam portion 21 has the maximum deformation amount in the vicinity of the center thereof. Therefore, it is desirable to arrange the deformation sensor 30 in the vicinity of the center of the beam portion 21.

Second Embodiment

Figure 7:
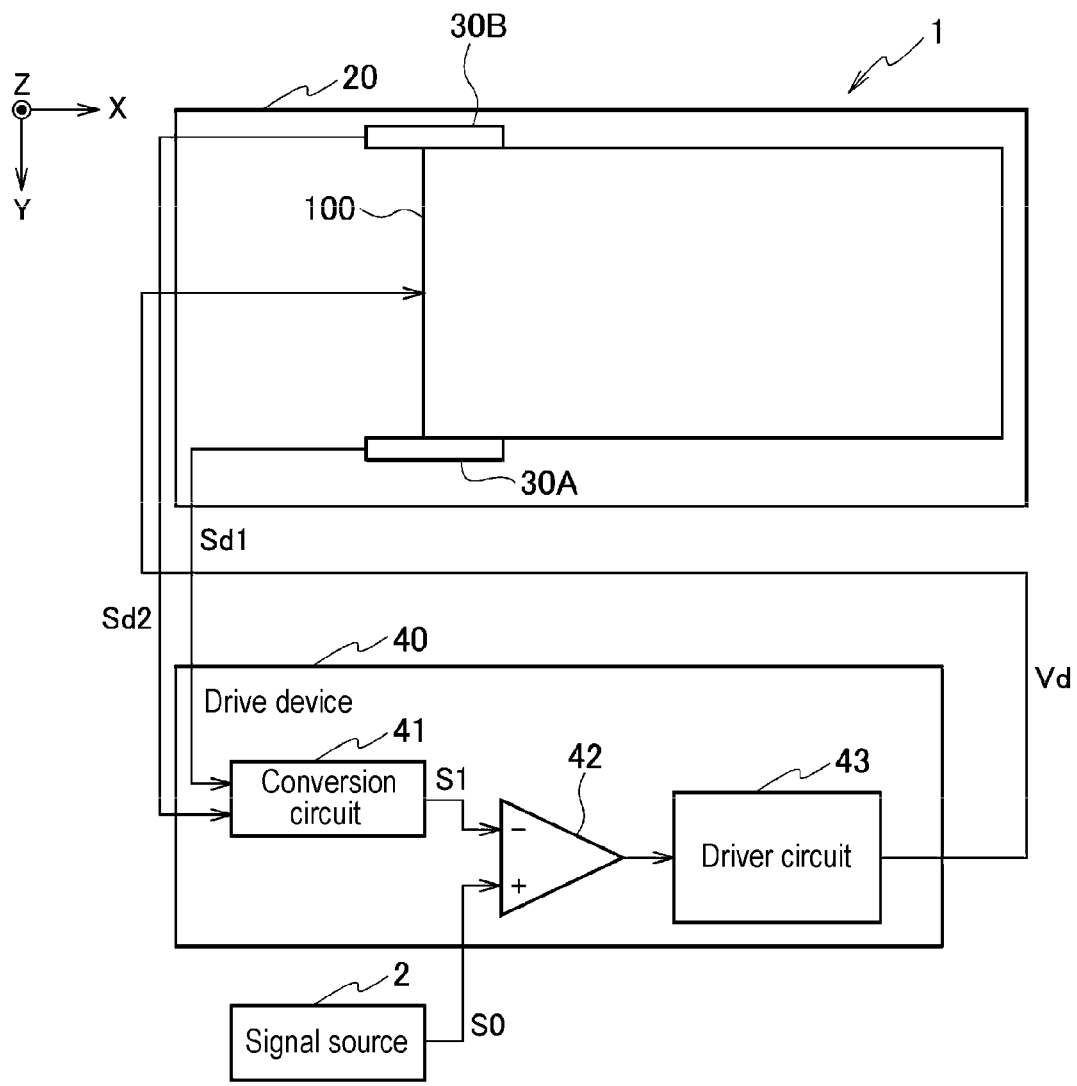
FIG. 7 is a schematic diagram showing a configuration of a control system according to a second embodiment.

In the control system 1 according to a second embodiment of the present disclosure, as shown in FIG. 7, a first deformation sensor 30A and a second deformation sensor 30B are arranged on the base 20 with the piezoelectric element 100 interposed therebetween. The first deformation sensor 30A and the second deformation sensor 30B are also collectively referred to as "deformation sensors 30." The control system 1 shown in FIG. 7 is different from the control system 1 shown in FIG. 1 in that the deformation sensors 30 are arranged on both sides of the piezoelectric element 100. Regarding other configurations, the second embodiment is the same as the first embodiment.

In the control system 1 shown in FIG. 7, the first deformation sensor 30A is arranged in the vicinity of one side surface of two side surfaces of the piezoelectric element 100 facing each other, and the second deformation sensor 30B is arranged in the vicinity of the other side surface. The first deformation sensor 30A converts the detected displacement of the base 20 into a first displacement signal Sd1 and outputs the first displacement signal Sd1. The second deformation sensor 30B converts the detected displacement of the base 20 into a second displacement signal Sd2 and outputs the second displacement signal Sd2.

In the control system 1 shown in FIG. 7, for example, an average value of the first displacement signal Sd1 and the second displacement signal Sd2 may be used as a displacement signal of the base 20. Alternatively, the first displacement signal Sd1 and the second displacement signal Sd2 may be added to obtain a value to be used as the displacement signal of the base 20. Further, the displacement signal of the base 20 may be calculated by averaging or adding the first displacement signal Sd1 and the second displacement signal Sd2 after weighting the first displacement signal Sd1 and the second displacement signal Sd2. For example, in order to consider the displacement of the base 20 more significantly in a region where the displacement is large, a weight may be assigned to the larger one of the first displacement signal Sd1 and the second displacement signal Sd2.

Arithmetic processing such as averaging, adding, and weighting the first displacement signal Sd1 and the second displacement signal Sd2 may be executed by, for example, the conversion circuit 41. Alternatively, an arithmetic processor that executes the arithmetic processing may be built in the error amplifier 42.

In the control system 1 according to the second embodiment, by arranging the deformation sensors 30 on both sides of the piezoelectric element 100, the displacement of the base 20 can be accurately detected even when, for example, the base 20 is deformed in a twisted manner.

Further, when the drive voltage Vd having a natural frequency of the piezoelectric element 100 or a frequency close to the natural frequency is applied to the piezoelectric element 100, the base 20 may vibrate at an amplitude lager than a desired amplitude. However, in the configuration of the control system 1 according to the second embodiment, the base 20 is suppressed from vibrating heavily as described above. Therefore, a desired amplitude can be obtained for the base 20.

In FIG. 7, there is shown an example in which two deformation sensors 30 are arranged symmetrically on both sides of the piezoelectric element 100. However, three or more deformation sensors 30 may be arranged around the piezoelectric element 100. In other respects, the control system 1 according to the second embodiment is substantially the same as that of the first embodiment. Therefore, duplicate description thereof is omitted.

Other Embodiments

Although the embodiments have been described above, the descriptions and drawings that form a part of the present disclosure should not be understood to limit the embodiments. In view of the present disclosure, various alternative embodiments, examples, and operational techniques will be obvious to those skilled in the art.

For example, the piezoelectric element 100 may be configured to include a bulk-like ferroelectric material other than the piezoelectric film 10 formed in a film shape.

Further, in the above description, there has been described the case where the control system 1 suppresses a decrease in accuracy of the displacement of the base 20 due to the displacement hysteresis. Further, according to the control system 1, it is possible to suppress a decrease in accuracy of the displacement of the base 20 due to other factors. For example, according to the control system 1, a decrease in accuracy of the displacement of the base 20 can be suppressed even for a change in characteristics caused by a change in mechanical characteristics due to mechanical deterioration of the base 20 and the piezoelectric film 10. The mechanical deterioration is, for example, extension of microdefects or cracks.

Further, when a large acceleration is applied to the base 20 due to application of an external impact or the like, the beam portion 21 of the base 20 and the piezoelectric element 100 are greatly shaken. At this time, the difference between the setting signal S0 and the displacement signal Sd may become larger than an assumed value. Therefore, when the difference between the setting signal S0 and the displacement signal Sd is larger than a predetermined difference set in advance, the result may be recorded in the drive device 40. From this record, it is possible to take measures in a case of "there is a history of excessive impact," for example, when repairing a failure of the base 20. Alternatively, a lifespan of the piezoelectric element 100 may be estimated by using information that the difference between the setting signal S0 and the displacement signal Sd is larger than the assumed value.

Figure 8:
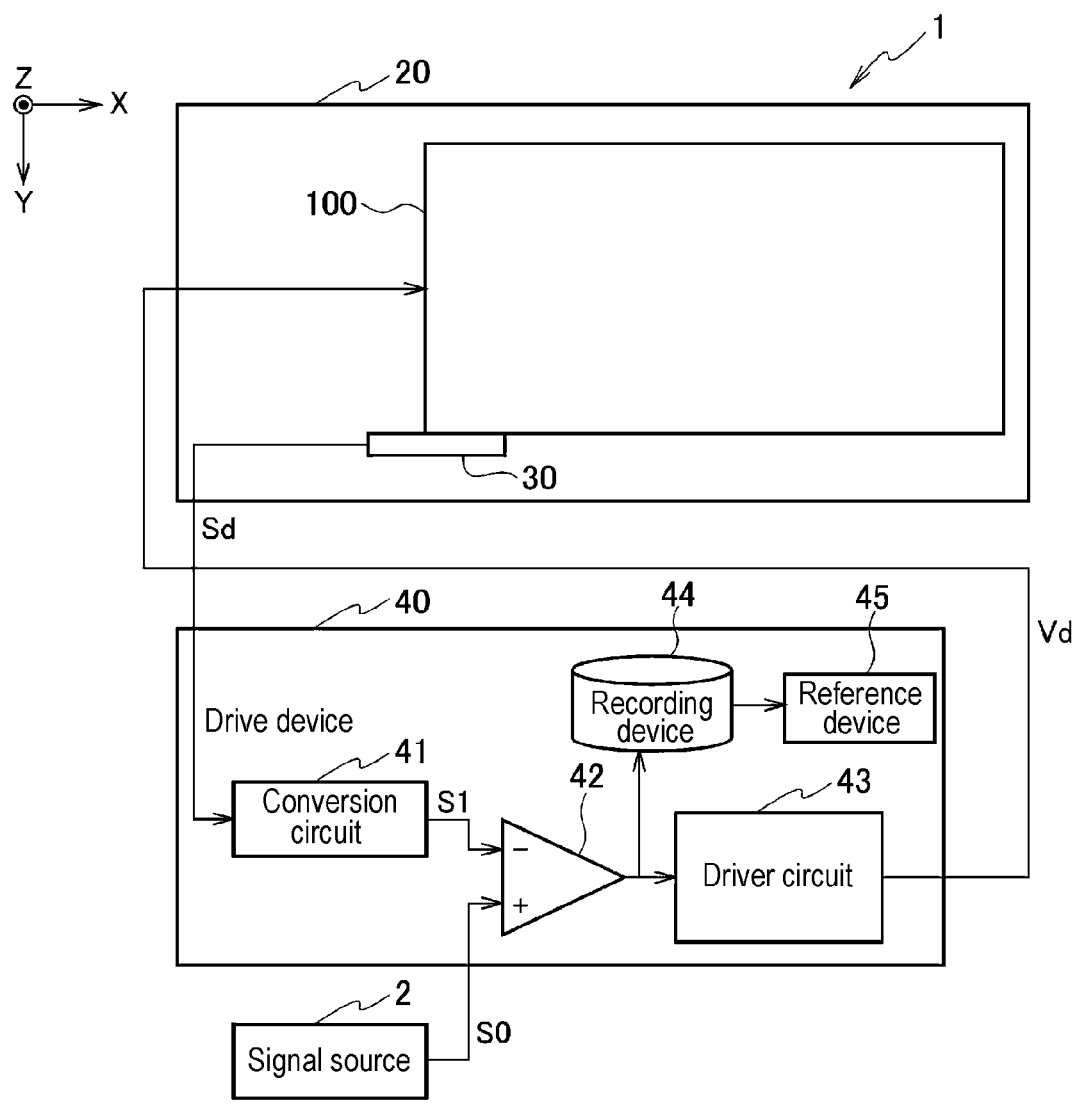
FIG. 8 is a schematic diagram showing a configuration of a control system according to another embodiment.

FIG. 8 shows an example of a configuration of the control system 1 that records a result of comparison of the setting signal S0 and the displacement signal Sd (hereinafter also referred to as "comparison result"). The comparison result is, for example, the difference between the setting signal S0 and the displacement signal Sd, or the difference between the difference between the setting signal S0 and the displacement signal Sd and an assumed value. The drive device 40 of the control system 1 shown in FIG. 8 includes a recording device 44 for recording the comparison result between the setting signal S0 and the displacement signal Sd, and a reference device 45 for referring to the comparison result recorded in the recording device 44 from outside. The recording device 44 records the comparison result. The reference device 45 allows referring to the comparison result recorded in the recording device 44 by referring to the reference device 45. The recording device 44 may be, for example, a hard disk device, a semiconductor memory, or the like. The reference device 45 may be, for example, a display device such as a display that displays the comparison result, a printer, or the like. The recording device 44 may record a result of comparing the comparison signal S1 obtained by converting the displacement signal Sd with the setting signal S0, as a result equivalent to the comparison result of the setting signal S0 and the displacement signal Sd. Alternatively, when the displacement signal Sd and the setting signal S0 are directly compared, the recording device 44 may record the comparison result between the displacement signal Sd and the setting signal S0.

According to the control system 1 shown in FIG. 8, for example, when the difference between the setting signal S0 and the displacement signal Sd is larger than the assumed value, the result is recorded in the recording device 44. A user of the control system 1 may take a measure corresponding to the case of "there is a history of excessive impact," by referring to the comparison result recorded in the recording device 44 by using the reference device 45. The recording device 44 and the reference device 45 may be provided outside the drive device 40.

As described above, the embodiments of the present disclosure include various embodiments not described herein.

According to the present disclosure in some embodiments, it is possible to improve accuracy of a displacement of a base having a piezoelectric element arranged thereon with respect to a drive voltage.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A control system for controlling a mechanical displacement of a base according to a setting signal from a signal source, the control system comprising:
a piezoelectric element having a deformation amount that varies according to a magnitude of a drive voltage applied to the piezoelectric element;
the base on which the piezoelectric element is arranged;

a deformation sensor configured to detect the displacement of the base caused by deformation of the piezoelectric element and output the displacement as a displacement signal; and a drive device configured to apply the drive voltage to the piezoelectric element while adjusting the magnitude of the drive voltage so as to reduce a difference between a value of the displacement signal and a value of the setting signal.

2. The control system of claim 1, wherein the drive device includes an error amplifier configured to output a difference between the displacement signal and the setting signal, and a driver circuit configured to receive an output of the error amplifier and apply the drive voltage to the piezoelectric element, and
wherein the driver circuit is further configured to adjust the drive voltage so as to reduce the output of the error amplifier.

3. The control system of claim 2, wherein the deformation sensor includes a piezoelectric resistor having an electrical resistance that varies due to mechanical deformation of the piezoelectric resistor, and
wherein the drive device is further configured to convert a resistance value of the piezoelectric resistor into a voltage to adjust the magnitude of the drive voltage.

4. The control system of claim 1, wherein at least two deformation sensors are arranged on the base with the piezoelectric element interposed therebetween.

5. The control system of claim 1, wherein the base includes a beam portion on which the piezoelectric element is arranged, and a support portion to which an end portion of the beam portion is fixed, and
wherein the deformation sensor is further configured to detect the displacement generated in the beam portion.

6. The control system of claim 1, wherein the piezoelectric element includes a piezoelectric film, and a first electrode film and a second electrode film which sandwich the piezoelectric film.

7. The control system of claim 1, wherein a dependency of the deformation amount of the piezoelectric element on the drive voltage varies between at a rising time of the drive voltage and at a falling time of the drive voltage.

8. The control system of claim 1, further comprising:
a recording device configured to record a comparison result between the setting signal and the displacement signal; and
a reference device configured for referring to the comparison result recorded in the recording device from outside.

9. A control method of controlling a mechanical displacement of a base according to a setting signal from a signal source, the control method comprising:
detecting the displacement of the base caused by deformation of a piezoelectric element, the piezoelectric element being arranged on the base and having a deformation amount that varies according to a magnitude of a drive voltage applied to the piezoelectric element;
outputting the detected displacement as a displacement signal; and
applying the drive voltage to the piezoelectric element while adjusting the magnitude of the drive voltage so as to reduce a difference between a value of the displacement signal and a value of the setting signal.

10. The control method of claim 9, further comprising:
detecting the displacement by a piezoelectric resistor having an electrical resistance that varies due to mechanical deformation of the piezoelectric resistor; and
converting a resistance value of the piezoelectric resistor into a voltage to adjust the magnitude of the drive voltage.

11. The control method of claim 9, further comprising detecting the displacement by at least two deformation sensors arranged to sandwich the piezoelectric element.

12. The control method of claim 9, wherein a dependency of the deformation amount of the piezoelectric element on the drive voltage varies between at a rising time of the drive voltage and at a falling time of the drive voltage.

* * * * *